United States Patent [19]

Fajt

[11] Patent Number: 4,501,991
[45] Date of Patent: Feb. 26, 1985

[54] LOW BREAKDOWN VOLTAGE, HIGH CURRENT GLOW LAMP

[75] Inventor: John Fajt, Wynnewood, Okla.

[73] Assignee: Xenell Corporation, Wynnewood, Okla.

[21] Appl. No.: 367,557

[22] Filed: Apr. 12, 1982

[51] Int. Cl.³ .................. H01J 1/14; H01J 1/30; H01J 17/48; H01J 61/64

[52] U.S. Cl. .................. 313/589; 313/630; 313/643

[58] Field of Search ............ 313/581, 589, 576, 603, 313/630, 637, 643, 243, 245, 233, 619

[56] References Cited

U.S. PATENT DOCUMENTS 2,729,762  1/1956  Hagen et al. .................. 313/589 X
3,814,971  6/1974  Bhattacharya et al. ............ 313/643

FOREIGN PATENT DOCUMENTS 218091  11/1957  Australia .................. 313/630

OTHER PUBLICATIONS

*Using and Understanding Miniature Neon Lamps* by William G. Miller, 1972.
*General Electric Glow Lamp Manual*, (Second Edition), 1966.

Primary Examiner—David K. Moore
Assistant Examiner—K. Wieder
Attorney, Agent, or Firm—E. Harrison Gilbert, III

[57] ABSTRACT

A glow lamp includes electrodes having both elements and oxides formed with a portion of the elements applied thereto to provide a glow lamp which can be used as a switch and which has a relatively low breakdown voltage but a relatively large current-handling capability. The glow lamp is constructed by a method which includes the step of causing relatively large, variable frequency currents to flow between adjacent electrodes for a limited time period to create the combination of elements and oxides on the electrodes.

10 Claims, 2 Drawing Figures

LOW BREAKDOWN VOLTAGE, HIGH CURRENT GLOW LAMP

BACKGROUND OF THE INVENTION

This invention relates generally to glow lamps constructed to have a relatively low breakdown voltage but a relatively high current-handling capability. This invention also relates generally to a method of manufacturing the same. More particularly, but not by way of limitation, this invention relates to a three-electrode glow lamp which has two sets of electrodes with each of the sets having one common electrode and which functions as a switch so that when a triggering breakdown voltage is applied to either of the sets of electrodes, a relatively large current flows between the two electrodes which are not common to both sets.

It is well known that glow lamps having two electrodes can be constructed and used as indicators or for other suitable uses. Three-electrode glow lamps are also known to the art, but these prior known lamps have been constructed so that only relatively small currents can be conducted therethrough. Such three-electrode glow lamps can be used as switches; however, the switching uses are limited because of the low current-handling capability.

It is also known to the art how to manufacture such two- and three-electrode glow lamps. Each of the electrodes is made of nickel-coated iron or other suitable substance on which a coating of barium carbonate ($BaCO_3$) is applied. The appropriate number of electrodes is then placed in a housing, and the combined structure is placed in an induction heater where the barium carbonate decomposes into molecules of carbon dioxide ($CO_2$) and barium oxide (BaO). The carbon dioxide is in a gaseous state and is pumped out of the housing, thereby leaving barium oxide on the surface of the electrodes. The lamp is then filled with a suitable gas, such as neon, and is placed in a sparking unit which applies high frequency voltages to the electrodes whereby high frequency currents flow between the electrodes so that the barium oxide decomposes into barium (Ba), which remains on the electrode, and molecules of ozone ($O_3$). This voltage application step is continued for an appropriate time, such as approximately sixty seconds, until the electrodes can no longer conduct relatively large currents therebetween. At such time a solid barium film is left on the electrodes. It is also known that strontium carbonate ($SrCO_3$) can be used with the barium carbonate in the foregoing process.

Barium (or strontium or other suitable material) is used because it is a good electron-emissive material which gives a relatively low breakdown voltage to the electrodes as compared to the nickel-coated iron electrodes alone. Although the performance of this prior art method results in a glow lamp which has a relatively low breakdown voltage, it is unable to pass relatively large currents when a breakdown voltage is applied.

Because prior known glow lamps have such a limited current-handling capability, there is the need for a glow lamp which has a relatively low breakdown voltage but which also is capable of conducting a relatively large current so that the glow lamp can be used, for example, as a switch in relatively large current-conducting circuits. Additionally, there is the need for a method of constructing a glow lamp so that it has these features of relatively low breakdown voltage, but relatively high current-handling capability.

SUMMARY OF THE INVENTION

The present invention overcomes the above-noted and other shortcomings of the prior art by providing a novel and improved glow lamp which has a relatively low breakdown voltage, but a relatively high current-handling capability. The present invention also provides a novel and improved method of manufacturing such a glow lamp.

Broadly, the glow lamp of the present invention comprises at least two electrodes, each of which is spaced from each other electrode and each of which has a member constructed of a substance which causes adjacent ones of the electrodes to require a first breakdown voltage to be applied thereto before a first appreciable current flows therebetween. The glow lamp also includes means, associated with each of the electrodes, for causing a current to flow between adjacent ones of electrodes at a second breakdown voltage which has a smaller effective magnitude than the first breakdown voltage. The glow lamp also includes additional means, associated with each of the electrodes, for allowing to flow another current having a greater effective magnitude than the current which would otherwise flow with only the initial means included in the glow lamp. The inventive glow lamp also includes a housing having the electrodes disposed therein. The glow lamp also includes a suitable gas contained within the housing.

More particularly, the initial means includes a material comprising barium, and the other means includes a compound comprising barium oxide.

The method of the present invention includes applying a coating of barium carbonate molecules to each of the electrodes which is to be used in a glow lamp. The method also includes separating carbon dioxide molecules from the barium carbonate molecules so that barium oxide molecules remain attached to each of the electrodes. After the electrodes have been mounted in a suitable housing, a current is flowed through the electrodes to remove oxygen atoms from a portion of the barium oxide molecules so that each of the electrodes has attached thereto a sufficient quantity of barium atoms to cause a reduced breakdown voltage rating between adjacent ones of the electrodes in the glow lamp housing and further so that each of the electrodes has attached thereto a sufficient quantity of barium oxide molecules to enable adjacent ones of the electrodes to conduct a relatively large current therebetween in response to an applied voltage which achieves the reduced breakdown voltage rating. The step of flowing the current includes applying variable frequency voltages to adjacent ones of electrodes for approximately four seconds.

Therefore, from the foregoing, it is a general object of the present invention to provide a novel and improved low breakdown voltage, high current glow lamp and method of manufacturing the same. Other and further objects, features and advantages of the present invention will be readily apparent to those skilled in the art when the following description of the preferred embodiment is read in conjunction with the accompanying drawings.

DETAILED DESCRIPTION OF THE PREFERRED EMBODIMENT

Figure 1:
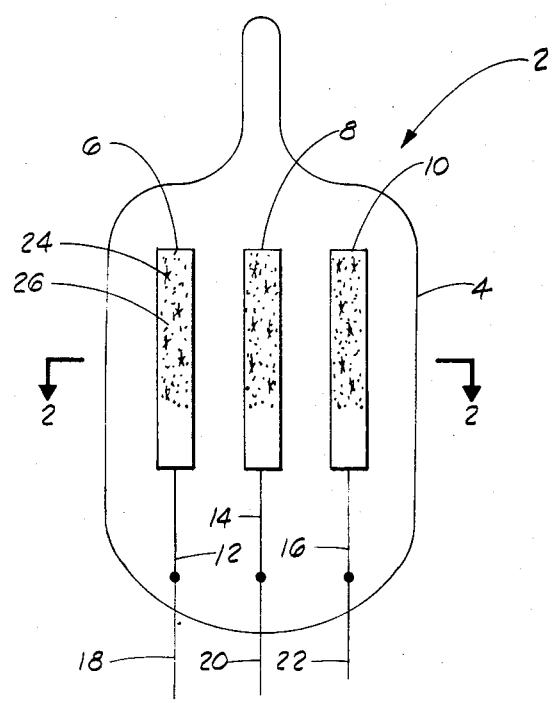
FIG. 1 is a schematic elevational view of a glow lamp constructed in accordance with the present invention.
Figure 2:
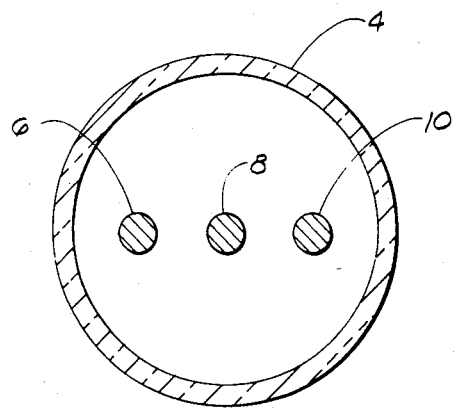
FIG. 2 is a schematic sectional top plan view of the glow lamp as taken along line 2—2 shown in FIG. 1 but not illustrating any exterior layers applied to the electrodes of the glow lamp.

With reference to FIGS. 1 and 2 a glow lamp 2 constructed in accordance with the present invention will be described. FIG. 1 illustrates that the glow lamp 2 includes a housing 4 which is constructed of any suitable substance, such as glass, as known to the art. The shape of the housing 4 as substantially depicted in FIG. 1 is also known to the art.

The housing 4 has a hollow interior in which a first electrode 6, a second electrode 8, and a third electrode 10 are disposed. Each of the electrodes 6, 8 and 10 is made of a suitable substance, such as nickel-coated iron, as known to the art. As is also known to the art, other substances, such as molybdenum, can be used to construct each of the electrodes.

The electrodes 6, 8 and 10 are disposed in the housing 4 so that they are substantially parallel to each other and so that longitudinal sections of the electrodes are coplanar. Each of the electrodes 6, 8 and 10 is butt-welded, or otherwise suitably connected to, a Dumet wire 12, 14, and 16, respectively, so that a suitable glass-to-metal seal between the housing 4 and each of the Dumet wires 12, 14 and 16 is achieved to secure each of the electrodes 6, 8 and 10 in their aforementioned relationships within the housing 4.

For permitting external electrical connections to be made to the electrodes 6, 8 and 10, the glow lamp 2 also includes electrically conductive leads 18, 20 and 22 butt-welded or otherwise suitably connected to the Dumet wires 12, 14 and 16, respectively. The leads 18, 20 and 22 are made of any suitable electrially conductive material, such as copper-coated iron.

When the electrodes have been disposed in the housing 4 as aforementioned, a first gap is defined between the spaced electrodes 6 and 8 and a second gap is defined between the spaced electrodes 8 and 10. When the glow lamp 2 is constructed as shown in the figures, the electrodes 6 and 8 form a first set of electrodes and the electrodes 8 and 10 form a second set of electrodes, each of the sets having the electrode 8 in common. When the sets of electrodes and corresponding first and second gaps thereof are formed, the glow lamp 2 has a rating of a first minimum breakdown voltage which must be applied to either the first set of electrodes or the second set of electrodes (for example, by means of the leads 18 and 20 or 20 and 22) before an appreciable current will flow through the first and second gaps and between the electrodes 6 and 10. If the electrodes 6, 8 and 10 are constructed only of the nickel-coated iron, this first minimum voltage which must be applied is relatively large, such as an effective voltage in excess of 100 $V_{rms}$. To lower this first minimum voltage, it is known that a material, such as barium, strontium, a combination thereof, or other suitable material (e.g., other suitable ones of the alkaline-earth metals of group IIa of the periodic chart of the elements), can be applied to each of the electrodes 6, 8 and 10. This material provides a means for causing the appreciable current to flow through either the first gap or the second gap if a second minimum voltage which is lower than the aforementioned first minimum voltage is applied to either the first set of electrodes comprising the electrodes 6 and 8 or the second set of electrodes comprising the second electrode 8 and third electrode 10. In other words, the application of this means causes the glow lamp 4 to have a relatively lower breakdown voltage rating than would otherwise exist if the means were not applied to the electrodes. This means is applied in the present invention to each of the electrodes 6, 8 and 10 as represented by the markings identified by the reference numeral 24 (not illustrated in FIG. 2).

Although it is known that such means applied to each of the electrodes reduces the nominal breakdown voltage rating, such means also reduces the amount of current which can be handled by the glow lamp 2. For example, glow lamps having substantially only barium and strontium applied thereto are known to have relatively low breakdown voltages; however, they are unable to conduct currents in excess of approximately ten milliamperes. To overcome this shortcoming, I have invented the inventive glow lamp 2 which includes additional means associated with the electrodes 6, 8 and 10 for allowing a greater current to be handled by the glow lamp 2 at the same relatively low breakdown voltage. This means includes a compound, such as barium oxide or strontium oxide or other suitable compound, which is applied to each of the electrodes along with the barium, strontium or other material. By including this additional means in the present invention, the inventive glow lamp 2 can conduct increased amounts of currents between its electrodes. For the preferred embodiment, an effective current of approximately ten amperes (rms) can be conducted between the electrodes 6 and 10 when a suitable breakdown voltage is applied to either electrodes 6 and 8 or electrodes 8 and 10. This additional means is represented by the markings in the figures identified by the reference numeral 26 (not illustrated in FIG. 2).

The glow lamp 2 also includes a suitable gas in the hollow interior of the housing 4 as known to the art. In the preferred embodiment the gas is a mixture of neon and krypton 85.

To make the preferred embodiment of the inventive glow lamp 2, each of the electrodes 6, 8 and 10 is coated with barium carbonate and strontium carbonate which are mixed together in a solution comprising ethyl acetate paint thinner, binder or other suitable substance.

The coated electrodes are inserted into the housing 4 and subjected to a bombarding step which includes inductively heating (by suitable means as known to the art) the electrode-housing combination to decompose the carbonates into carbon dioxide, barium oxide and strontium oxide. The carbon dioxide is gaseous and is removed, such as by pumping, from the hollow interior of the housing 4.

The carbon dioxide-evacuated housing 4 is filled with another gas of a suitable type as known to the art and the housing 4 is sealed as also known to the art. This sealing is achieved through a glass-to-metal bond between the housing 4 and the Dumet wires 12, 14 and 16. The gas which is used is preferably any suitable composition which enhances deionization for limiting the current-conducting time period when sufficient voltage transients are detected by the glow lamp. In the preferred embodiment the gas is a mixture of neon and krypton 85.

The foregoing steps are known to the art as is a step wherein a high frequency current is caused to flow for a relatively long time period between adjacent ones of the electrodes to separate the oxygen from the barium oxide and strontium oxide residues left on the electrodes after the bombarding step. More particularly, what is known to the art is to cause such a high frequency current to be conducted through the electrodes for an extended period of time sufficient to remove all or substantially all of the oxygen from the barium oxide and strontium oxide molecules. This current is caused to flow by applying a variable frequency voltage to the electrodes. This voltage is provided by a radio frequency generator and spark gap apparatus of a suitable type as known to the art.

The present invention, on the other hand, does not perform this current conducting, or voltage application, step for that extended time period. The present inventive method maintains pulses of high frequency current flowing through the electrodes only for that time period which is sufficient to remove enough of the oxygen atoms from the molecules to lower the breakdown voltage to the necessary level. In the preferred embodiment this time period is approximately four seconds, as compared to the approximately sixty-second time period known to the prior art. After the performance of the time-limited current conducting step of the present invention, not only are atoms of barium and strontium left applied to the electrodes, but also molecules of barium oxide and strontium oxide remain. Although the preferred method calls for this step to be performed for approximately four seconds, in general the step requires a time which leaves a sufficient quantity of the oxides on the electrodes. "Sufficient" is generally defined herein to mean that there are enough oxide molecules to give the glow lamp a large current-conducting capability, but not so many oxide molecules that the glow lamp does not have the desired low breakdown voltage rating or level. With respect to the specific preferred embodiment, a substantial amount of oxides remain, "substantial" meaning having more oxides than individual elements (i.e., more barium oxide and strontium oxide than barium and strontium). When there is a "substantial" amount of the oxides, there is still a "sufficient" quantity of the individual element or elements to yield the low breakdown voltage level.

At the conclusion of the current conducting step of the present invention, there are the elements of barium and strontium as well as the compounds of barium oxide and strontium oxide left applied to the electrodes 6, 8 and 10. Ozone has also been formed by the release of the oxygen atoms from some of the former barium oxide and strontium oxide molecules. This ozone will either tie down on the pure materials or remain gaseous, but the ozone does not have an effect on the operation of the inventive glow lamp 2.

From this method and the resulting structure depicted in the drawings as the glow lamp 2, there is achieved a device which can act as a switch and which has a relatively low breakdown voltage at which it enters a current conductive mode wherein a relatively large current can be conducted therethrough. In the preferred embodiment described hereinabove, these features include a nominal breakdown voltage between approximately 80 $V_{rms}$ and approximately 100 $V_{rms}$ and a current-handling capability of approximately ten amperes (rms). Other specific parameters include the length of the housing 4 being approximately 0.75 inches and the width of the housing 4 being approximately 0.22 inches to approximately 0.25 inches. The leads 18, 20 and 22 are between approximately 1 inch and approximately 2.1 inches in length.

The preferred embodiment glow lamp 2 does not breakdown when a 140 $V_{rms}$ potential is connected to a load across which the electrodes 6 and 10 are connected in parallel and to which the electrode 8 is connected at a locus center-tapping the resistance or impedance of the load. The glow lamp 2 is also constructed in the preferred embodiment so that it can conduct a sufficient current to cause a 1.6 A fuse to open within approximately 80 milliseconds. The preferred embodiment described hereinabove can conduct an effective current of approximately 10 amperes (rms) between the electrodes 6 and 10 when the breakdown voltage level established by the barium and strontium is met. The glow lamp 2 is also able to withstand transients of up to 5000 $V_{peak}$ for 10 microseconds.

Thus, the present invention is well adapted to carry out the objects and attain the ends and advantages mentioned above as well as those inherent therein. While a preferred embodiment of the invention has been described for the purpose of this disclosure, numerous changes in the construction and arrangement of parts can be made by those skilled in the art, which changes are encompassed within the spirit of this invention as defined by the appended claims.

What is claimed is:

1. A glow lamp, comprising:
   at least two electrodes, each electrode being spaced from each other electrode and having a member constructed of a substance which causes adjacent ones of said electrodes to require a first breakdown voltage to be applied thereto before a first appreciable current flows therebetween;
   a material applied to each of said members for causing adjacent ones of said electrodes to require a second breakdown voltage within the range between approximately 80 volts (rms) and approximately 100 volts (rms) to be applied thereto before a second appreciable current flows therebetween, said second breakdown voltage being less than said first breakdown voltage;
   a compound applied to each of said members for permitting a third appreciable current of at least approximately 10 amperes (rms) to flow between respective ones of said electrodes when said second breakdown voltage is applied, said third appreciable current being greater than said second appreciable current; and
   a housing having said electrodes disposed therein.

2. A glow lamp as defined in claim 1, wherein:
   said material comprises barium; and
   said compound comprises barium oxide.

3. A glow lamp as defined in claim 2, wherein said substance comprises nickel-coated iron.

4. A glow lamp as defined in claim 1, wherein:
   said material consists essentially of barium; and
   said compound consists essentially of barium oxide.

5. A glow lamp as defined in claim 4, wherein said substance comprises nickel-coated iron.

6. A glow lamp as defined in claim 1, wherein:
   said material consists of barium; and
   said compound consists of barium oxide.

7. A glow lamp as defined in claim 6, wherein said substance comprises nickel-coated iron.

8. A glow lamp, comprising:
   a first electrode;
   a second electrode spaced from said first electrode to define a first gap therebetween through which a current will flow when a first minimum voltage is applied to said first and second electrodes;

a third electrode spaced from said second electrode to define a second gap therebetween through which a current will flow when said first minimum voltage is applied to said second and third electrodes;

means, associated with said first, second and third electrodes, for causing said current to flow through either said first gap or said second gap if a second minimum voltage is applied to either said first and second electrodes or said second and third electrodes, said second minimum voltage having a smaller effective magnitude than said first minimum voltage;

means, associated with said first, second and third electrodes, for allowing a current having an effective magnitude of at least approximately 10 amperes to flow between said first electrode and said third electrode in response to said second minimum voltage; and means for housing said first, second and third electrodes.

9. A glow lamp, comprising:

a first set of electrodes including a first electrode and a second electrode spaced from said first electrode, said first set of electrodes having a first predetermined minimum breakdown voltage rating, a second set of electrodes including said second electrode and a third electrode spaced from said second electrode, said second set of electrodes having a second predetermined minimum breakdown voltage rating;

barium disposed in a sufficient quantity on each of said first, second and third electrodes for lowering the effective magnitudes of said first and second predetermined minimum breakdown voltage ratings;

barium oxide disposed in a substantial quantity on each of said first, second and third electrodes wherein there is more barium oxide than barium disposed on said first, second and third electrodes so that a current of at least approximately 10 amperes can flow in said glow lamp in response to said lowered first and second predetermined minimum breakdown voltage ratings being met or exceeded by applied voltages; and means for housing said first and second sets of electrodes.

10. A glow lamp, comprising:

a first electrode;

a second electrode associated with said first electrode so that a breakdown voltage can be applied thereto to light said glow lamp;

a third electrode associated with said second electrode so that a breakdown voltage can be applied thereto to light said glow lamp;

a first substance disposed on each of said electrodes for making said electrodes responsive to a predetermined breakdown voltage;

a second substance disposed on each of said electrodes for enabling two of said electrodes to conduct an electrical current, which electrical current is greater than could be conducted with only said first substance disposed on said electrodes, when said predetermined breakdown voltage is supplied to a respective pair of said electrodes, wherein said first substance and said second substance are derived from a composition of matter which is decomposable into said first substance and said second substance in response to a current flowing through each of said electrodes for approximately four seconds so that said second substance is left on said electrode in a quantity sufficient to enable said glow lamp to have a large current conducting capability of at least approximately 10 amperes at said predetermined breakdown voltage which is established by the quantity of said first substance derived from said composition; and means for housing said electrodes.

* * * * *